US012667024B2

(12) United States Patent
Kim et al.

(10) Patent No.: US 12,667,024 B2
(45) Date of Patent: Jun. 23, 2026

(54) BARRIERS FOR SELECTIVE EXPOSED MOLDING OF VARIABLE HEIGHT COMPONENTS

(71) Applicant: Apple Inc., Cupertino, CA (US)

(72) Inventors: Kyusang Kim, Singapore (SG); David M Kindlon, Felton, CA (US); Kishore N Renjan, Singapore (SG); Manoj Vadeentavida, Singapore (SG); Bilal Mohamed Ibrahim Kani, Singapore (SG); Benjamin J Grena, San Francisco, CA (US); Ali N Ergun, Sunnyvale, CA (US); Jerzy S Guterman, Sunnyvale, CA (US); Jee Tung Tan, Singapore (SG); Steven Webster, Singapore (SG); Parin R Dedhia, Sunnyvale, CA (US); Howell John Chua Toc, Singapore (SG); Mandar S Painaik, Chandler, AZ (US); Abhay Maheshwari, Monte Sereno, CA (US); Wyeman Chen, Newark, CA (US); Yanfeng Chen, San Ramon, CA (US); Andrew N Leopold, San Francisco, CA (US); Jun Zhang, Cupertino, CA (US); Dhruv Gaba, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 388 days.

(21) Appl. No.: 18/475,054

(22) Filed: Sep. 26, 2023

(65) Prior Publication Data

US 2025/0105228 A1 Mar. 27, 2025

(51) Int. Cl.
*H01L 25/16* (2023.01)
*H10W 90/00* (2026.01)

(52) U.S. Cl.
CPC .................................... *H10W 90/00* (2026.01)

(58) Field of Classification Search
CPC ..... H01L 25/167; H01L 25/165; H01L 21/56; H01L 23/16; H01L 23/3121;
(Continued)

(56) References Cited

U.S. PATENT DOCUMENTS

| | | | |
|---|---|---|---|
| 9,105,613 B1 * | 8/2015 | Chen | H01L 23/552 |
| 2006/0071316 A1 * | 4/2006 | Garth | H01L 23/02 |
| | | | 257/E21.705 |

(Continued)

*Primary Examiner* — Tong-Ho Kim
(74) *Attorney, Agent, or Firm* — Aikin & Gallant, LLP

(57) ABSTRACT

Packages and methods of assembly are described in which barriers are utilized during overmolding to improve volumetric efficiency. In one embodiment, a barrier includes multiple variable height components located on an interior of the barrier, where the barrier prevents the variable height components from being overmolded during the encapsulation process. In one embodiment, a barrier includes a camera module mounted on an image sensor located on an interior of the barrier, where the barrier prevents the camera module and image sensor from being overmolded during the encapsulation process. In an embodiment, a barrier is mounted on a secondary tier with the secondary tier mounted on a primary tier, where the barrier prevents multiple connector components located on an interior of the barrier from being overmolded during the encapsulation process.

17 Claims, 16 Drawing Sheets

(58) Field of Classification Search
CPC ..... H01L 25/0652; H01L 25/16; H01L 25/50;
H01L 2225/06572
USPC ....................................................... 257/433
See application file for complete search history.

(56) References Cited

U.S. PATENT DOCUMENTS

2016/0337561 A1* 11/2016 Park ...................... H10F 39/011
2021/0109439 A1* 4/2021 Eggum ..................... G03F 1/66
2021/0257311 A1* 8/2021 Hsieh ...................... H01L 25/16
2023/0115729 A1* 4/2023 Yu ........................... H01L 24/97
257/774

\* cited by examiner

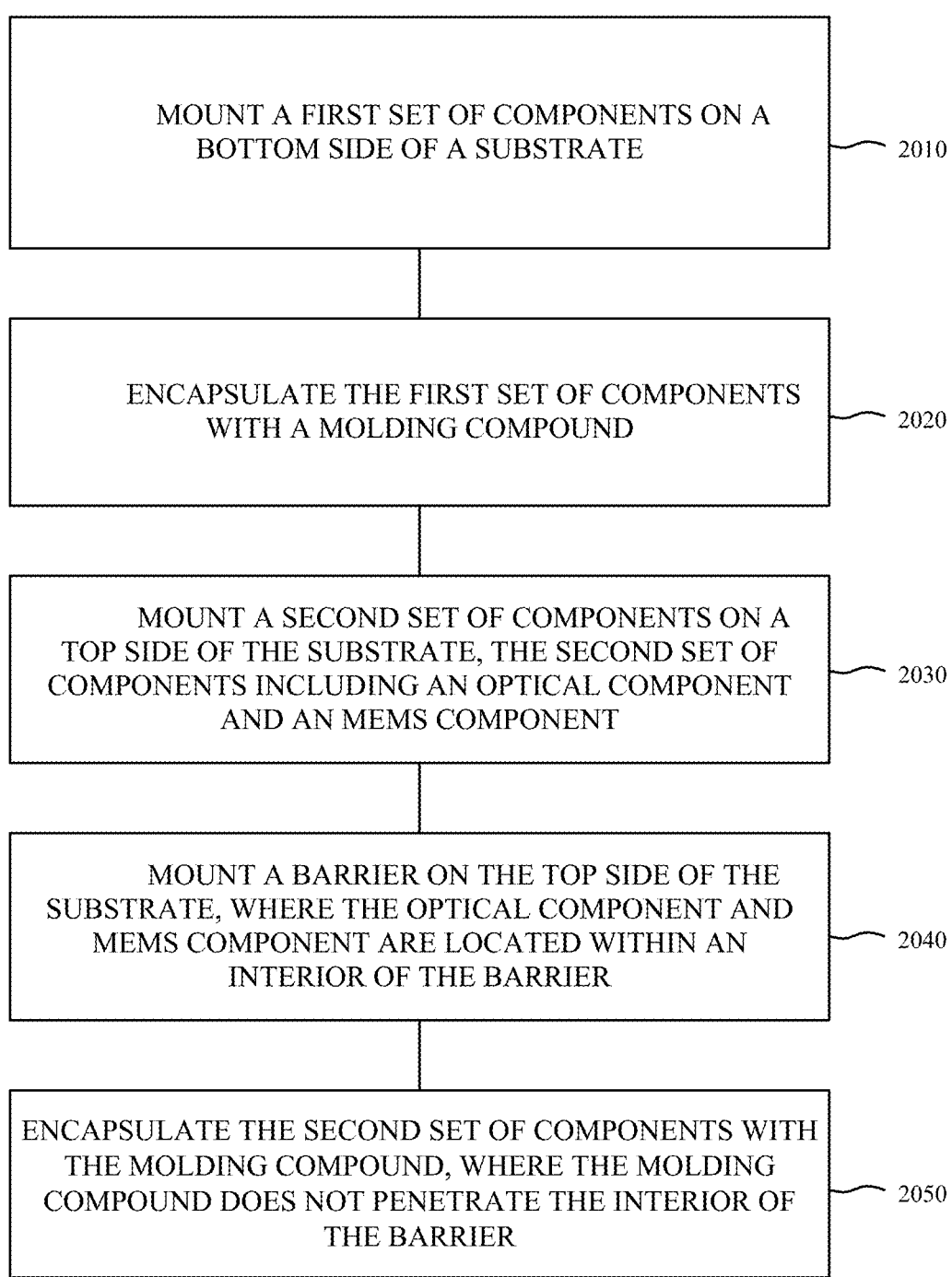

MOUNT A FIRST SET OF COMPONENTS ON A BOTTOM SIDE OF A SUBSTRATE — 2010

ENCAPSULATE THE FIRST SET OF COMPONENTS WITH A MOLDING COMPOUND — 2020

MOUNT A SECOND SET OF COMPONENTS ON A TOP SIDE OF THE SUBSTRATE, THE SECOND SET OF COMPONENTS INCLUDING AN OPTICAL COMPONENT AND AN MEMS COMPONENT — 2030

MOUNT A BARRIER ON THE TOP SIDE OF THE SUBSTRATE, WHERE THE OPTICAL COMPONENT AND MEMS COMPONENT ARE LOCATED WITHIN AN INTERIOR OF THE BARRIER — 2040

ENCAPSULATE THE SECOND SET OF COMPONENTS WITH THE MOLDING COMPOUND, WHERE THE MOLDING COMPOUND DOES NOT PENETRATE THE INTERIOR OF THE BARRIER — 2050

*FIG. 2*

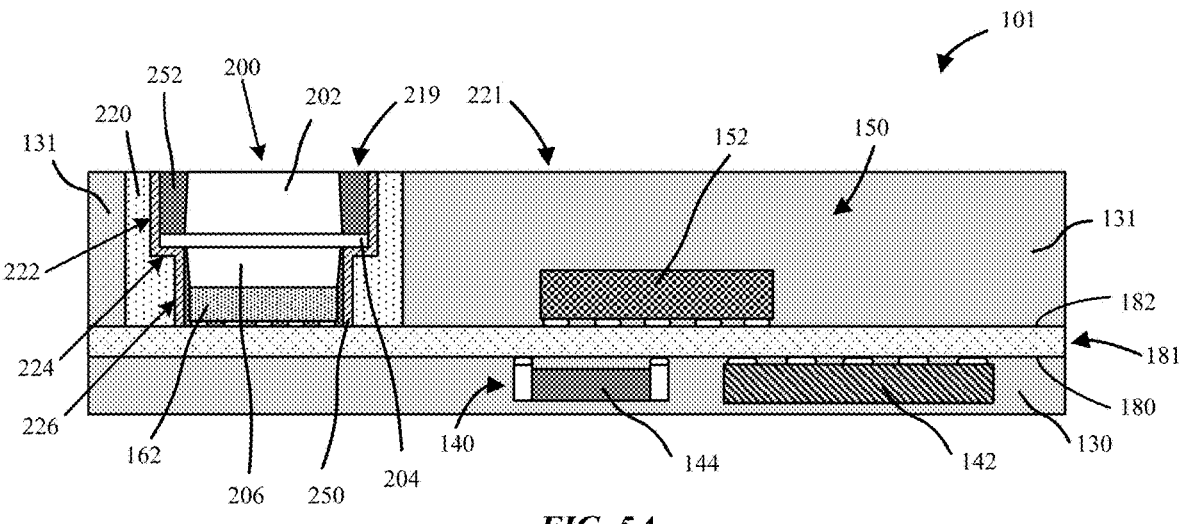
*FIG. 5A*
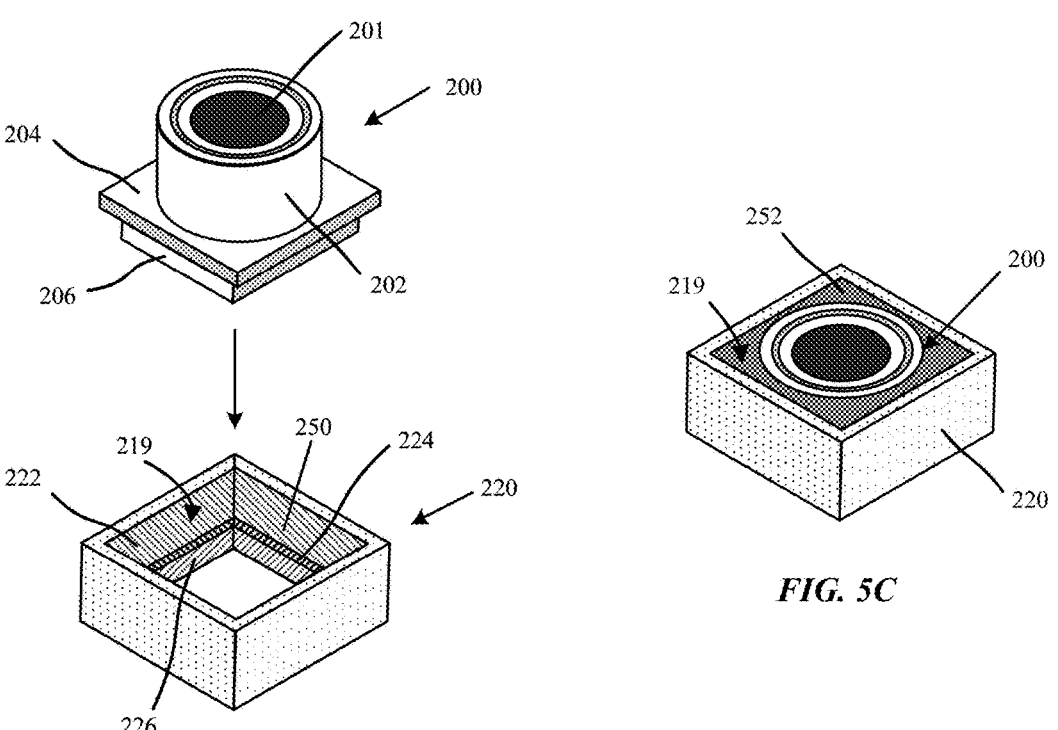
*FIG. 5B*
*FIG. 5C*

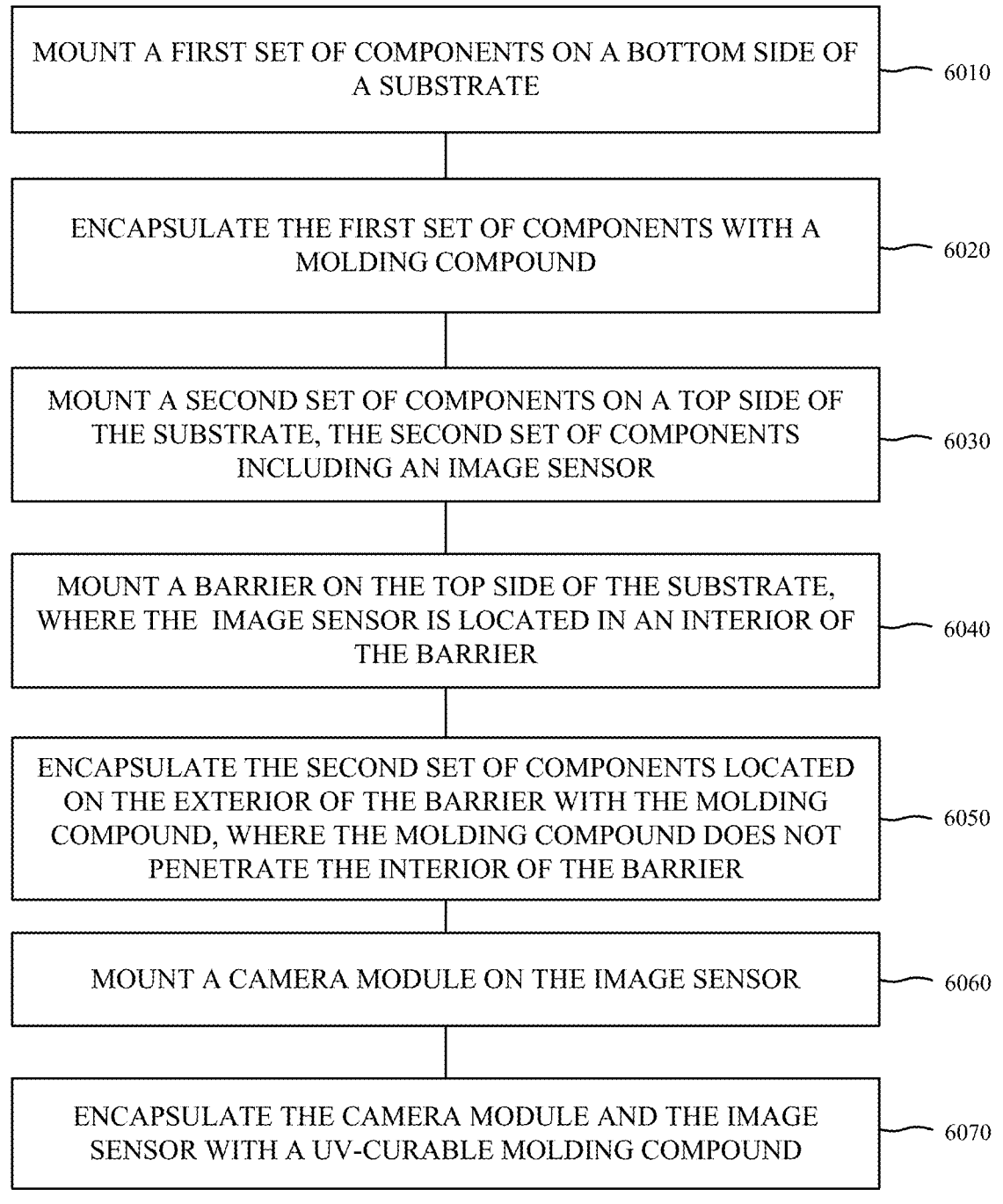

| MOUNT A FIRST SET OF COMPONENTS ON A BOTTOM SIDE OF A SUBSTRATE | 6010 |

| ENCAPSULATE THE FIRST SET OF COMPONENTS WITH A MOLDING COMPOUND | 6020 |

| MOUNT A SECOND SET OF COMPONENTS ON A TOP SIDE OF THE SUBSTRATE, THE SECOND SET OF COMPONENTS INCLUDING AN IMAGE SENSOR | 6030 |

| MOUNT A BARRIER ON THE TOP SIDE OF THE SUBSTRATE, WHERE THE IMAGE SENSOR IS LOCATED IN AN INTERIOR OF THE BARRIER | 6040 |

| ENCAPSULATE THE SECOND SET OF COMPONENTS LOCATED ON THE EXTERIOR OF THE BARRIER WITH THE MOLDING COMPOUND, WHERE THE MOLDING COMPOUND DOES NOT PENETRATE THE INTERIOR OF THE BARRIER | 6050 |

| MOUNT A CAMERA MODULE ON THE IMAGE SENSOR | 6060 |

| ENCAPSULATE THE CAMERA MODULE AND THE IMAGE SENSOR WITH A UV-CURABLE MOLDING COMPOUND | 6070 |

*FIG. 6*

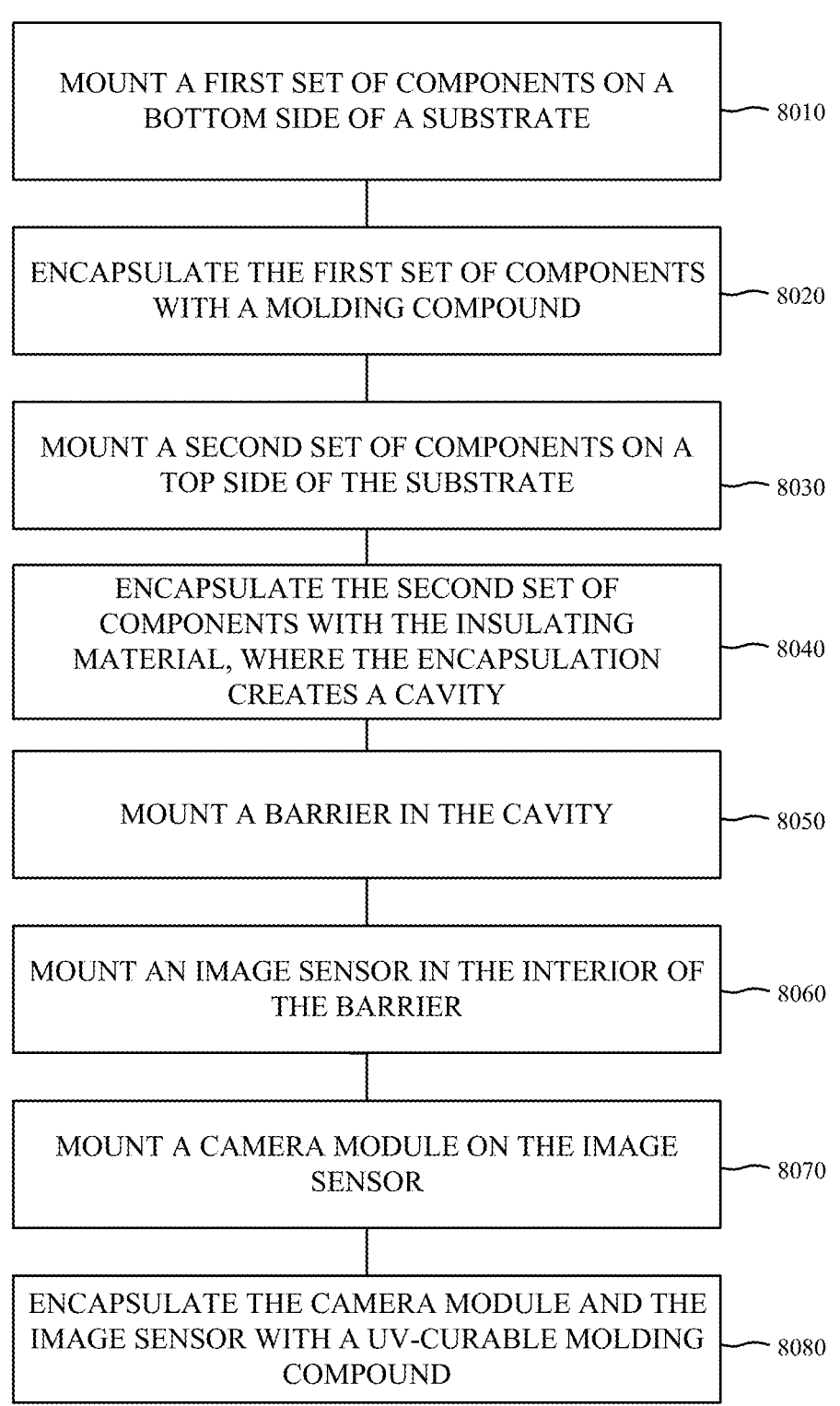

MOUNT A FIRST SET OF COMPONENTS ON A BOTTOM SIDE OF A SUBSTRATE — 8010

ENCAPSULATE THE FIRST SET OF COMPONENTS WITH A MOLDING COMPOUND — 8020

MOUNT A SECOND SET OF COMPONENTS ON A TOP SIDE OF THE SUBSTRATE — 8030

ENCAPSULATE THE SECOND SET OF COMPONENTS WITH THE INSULATING MATERIAL, WHERE THE ENCAPSULATION CREATES A CAVITY — 8040

MOUNT A BARRIER IN THE CAVITY — 8050

MOUNT AN IMAGE SENSOR IN THE INTERIOR OF THE BARRIER — 8060

MOUNT A CAMERA MODULE ON THE IMAGE SENSOR — 8070

ENCAPSULATE THE CAMERA MODULE AND THE IMAGE SENSOR WITH A UV-CURABLE MOLDING COMPOUND — 8080

*FIG. 8*

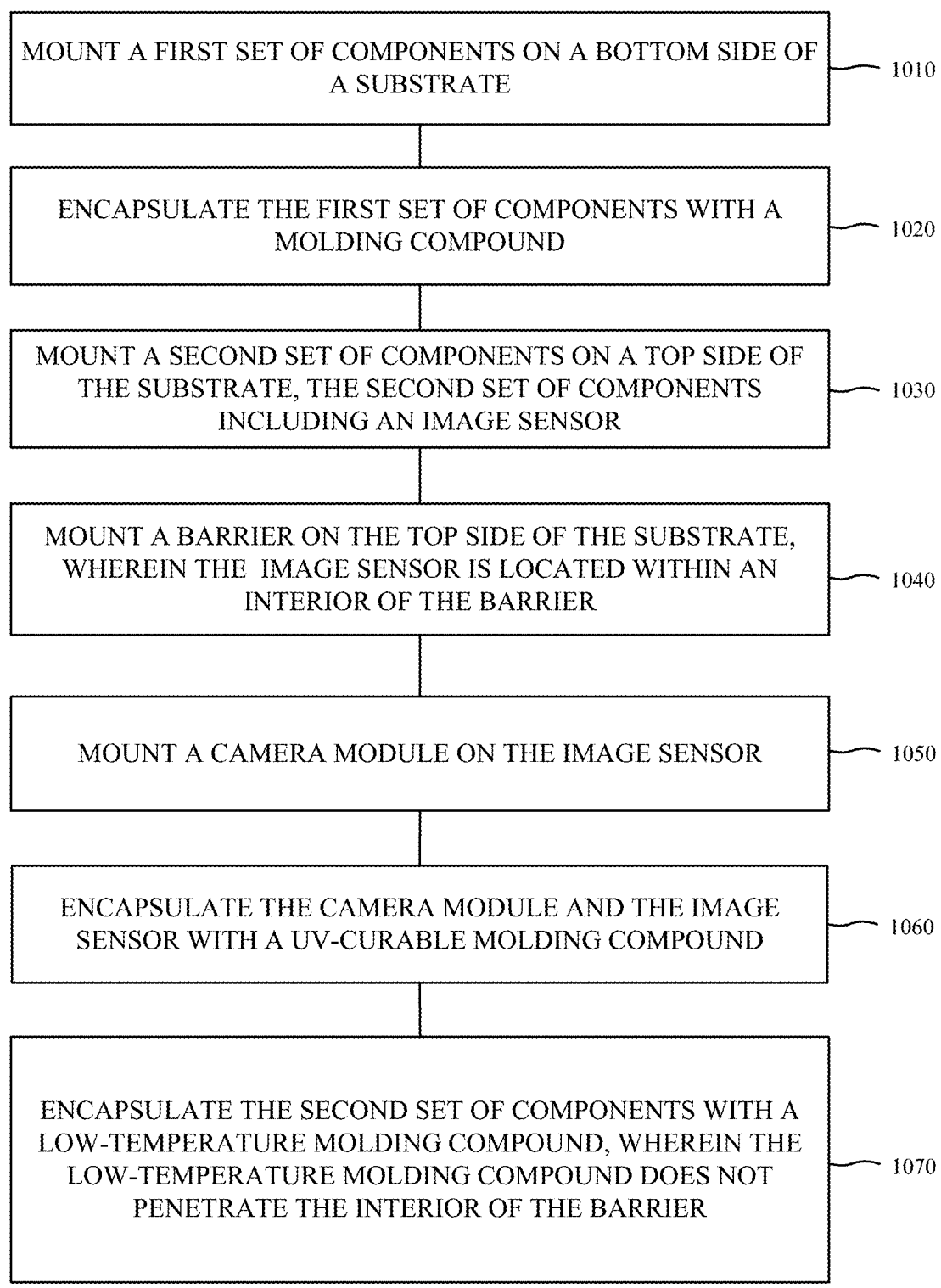

MOUNT A FIRST SET OF COMPONENTS ON A BOTTOM SIDE OF A SUBSTRATE — 1010

ENCAPSULATE THE FIRST SET OF COMPONENTS WITH A MOLDING COMPOUND — 1020

MOUNT A SECOND SET OF COMPONENTS ON A TOP SIDE OF THE SUBSTRATE, THE SECOND SET OF COMPONENTS INCLUDING AN IMAGE SENSOR — 1030

MOUNT A BARRIER ON THE TOP SIDE OF THE SUBSTRATE, WHEREIN THE IMAGE SENSOR IS LOCATED WITHIN AN INTERIOR OF THE BARRIER — 1040

MOUNT A CAMERA MODULE ON THE IMAGE SENSOR — 1050

ENCAPSULATE THE CAMERA MODULE AND THE IMAGE SENSOR WITH A UV-CURABLE MOLDING COMPOUND — 1060

ENCAPSULATE THE SECOND SET OF COMPONENTS WITH A LOW-TEMPERATURE MOLDING COMPOUND, WHEREIN THE LOW-TEMPERATURE MOLDING COMPOUND DOES NOT PENETRATE THE INTERIOR OF THE BARRIER — 1070

*FIG. 10*

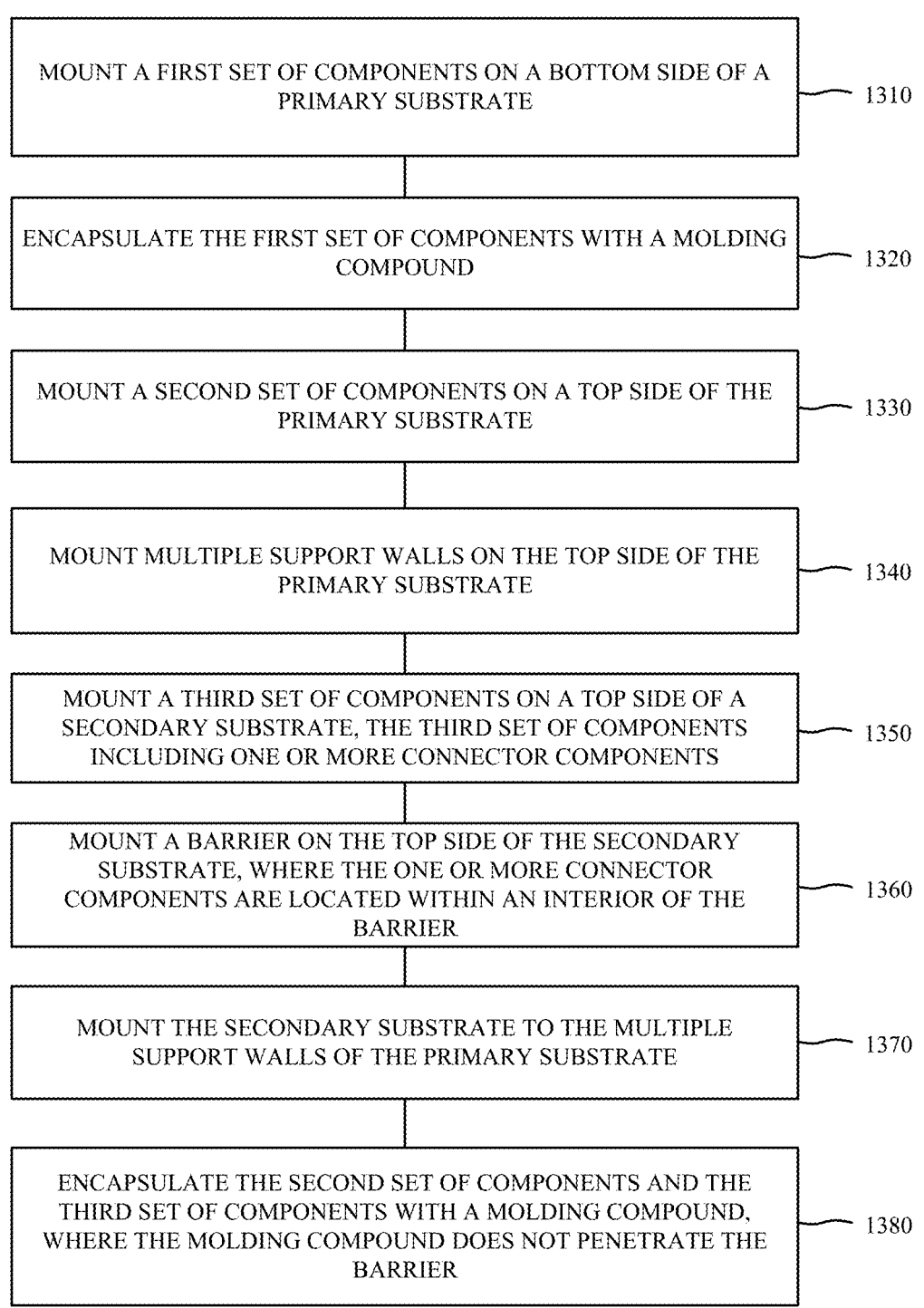

MOUNT A FIRST SET OF COMPONENTS ON A BOTTOM SIDE OF A PRIMARY SUBSTRATE — 1310

ENCAPSULATE THE FIRST SET OF COMPONENTS WITH A MOLDING COMPOUND — 1320

MOUNT A SECOND SET OF COMPONENTS ON A TOP SIDE OF THE PRIMARY SUBSTRATE — 1330

MOUNT MULTIPLE SUPPORT WALLS ON THE TOP SIDE OF THE PRIMARY SUBSTRATE — 1340

MOUNT A THIRD SET OF COMPONENTS ON A TOP SIDE OF A SECONDARY SUBSTRATE, THE THIRD SET OF COMPONENTS INCLUDING ONE OR MORE CONNECTOR COMPONENTS — 1350

MOUNT A BARRIER ON THE TOP SIDE OF THE SECONDARY SUBSTRATE, WHERE THE ONE OR MORE CONNECTOR COMPONENTS ARE LOCATED WITHIN AN INTERIOR OF THE BARRIER — 1360

MOUNT THE SECONDARY SUBSTRATE TO THE MULTIPLE SUPPORT WALLS OF THE PRIMARY SUBSTRATE — 1370

ENCAPSULATE THE SECOND SET OF COMPONENTS AND THE THIRD SET OF COMPONENTS WITH A MOLDING COMPOUND, WHERE THE MOLDING COMPOUND DOES NOT PENETRATE THE BARRIER — 1380

*FIG. 13*

BARRIERS FOR SELECTIVE EXPOSED MOLDING OF VARIABLE HEIGHT COMPONENTS

BACKGROUND

Field

Embodiments described herein relate to semiconductor packaging, and more particularly to the overmolding of components.

Background Information

The current market demand for portable and mobile electronic devices such as smartphones, tablets, Bluetooth devices, wearable devices and other portable/mobile devices calls for increased functionality within a decreased footprint. System-in-package ("SiP") technology, which integrates a multitude of components and functionalities into a single package, has become more popular in order to meet such demand. However, the high-level integration of multiple components in such close proximity can cause thermal and mechanical stress-related issues. As such, systems are designed with an eye toward protecting components against these thermal and mechanical stress-related issues while also optimizing components for light/signal transmission and reception. In particular, encapsulation or overmolding processes (e.g., transfer molding, compression molding, etc.) can be utilized to provide such a balance between preventative and performative considerations.

SUMMARY

Embodiments describe electronic packages and methods of assembly in which a barrier prevents variable height components from being overmolded during an encapsulation process. In an embodiment, a package includes a barrier that prevents a molding compound from penetrating an interior of the barrier and therefore prevents the components located within the interior of the barrier from being encapsulated, but allows components located on an exterior of the barrier to be encapsulated. In an embodiment, an electronic package includes a barrier with an image sensor and a camera module located within an interior of the barrier, where the barrier allows the image sensor and the camera module to be encapsulated in accordance with a low-temperature encapsulation process, and the components located in an exterior of the barrier to be encapsulated in accordance with a high-temperature encapsulation process. In an embodiment, a multi-tiered package includes a primary substrate with multiple support walls and secondary substrate mounted on the multiple support walls, where the secondary substrate includes a barrier that prevents a molding compound from encapsulating connector components located on an interior of the barrier but allows components located in an exterior of the barrier, on both the primary and secondary substrates, to be encapsulated.

BRIEF DESCRIPTION OF THE DRAWINGS

FIG. 2 is a process flow of a method of fabricating an electronic package including a barrier in accordance with an embodiment.

FIG. 5A is a schematic cross-sectional side view illustration of an electronic package including a barrier with a camera module in accordance with an embodiment.

FIG. 5B is an isometric view of a barrier with a camera module before mounting in accordance with an embodiment.

FIG. 5C is an isometric view of a barrier with a camera module after mounting in accordance with an embodiment.

FIG. 6 is a process flow of a method of fabricating an electronic package including a barrier with a camera module in accordance with an embodiment.

FIG. 8 is a process flow of a method of fabricating an electronic package including a barrier with a camera module in accordance with an embodiment.

FIG. 10 is a process flow of a method of fabricating an electronic package including a barrier with a camera module in accordance with an embodiment.

FIG. 13 is a process flow of a method of fabricating a multi-tiered electronic package with a barrier in accordance with an embodiment.

DETAILED DESCRIPTION

Figure 1A:
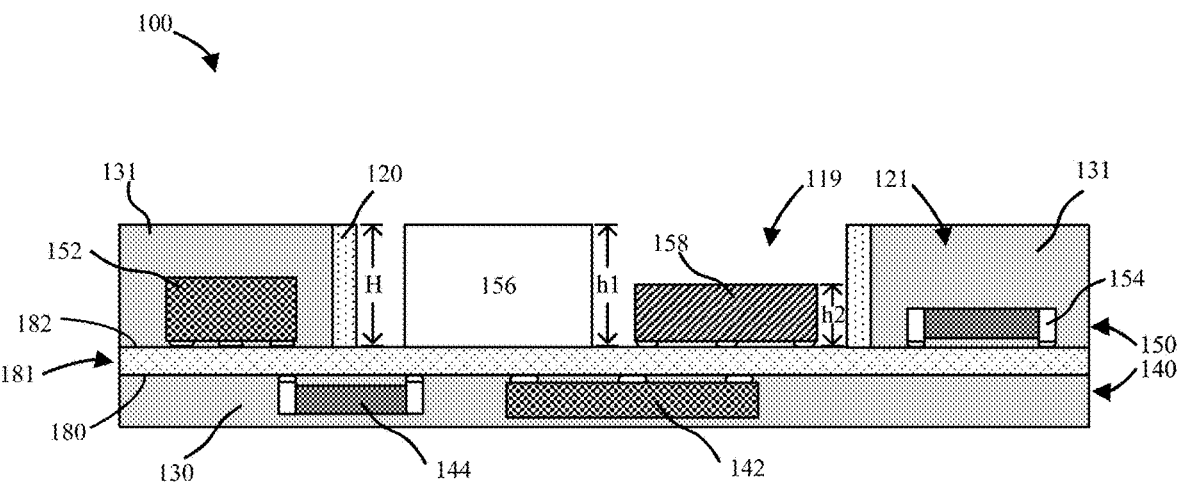
FIG. 1A is a schematic cross-sectional side view illustration of an electronic package including a barrier in accordance with an embodiment.

During traditional encapsulation processes (e.g., transfer molding), a mold chase is lowered over a substrate to create a cavity and then a molding compound is injected into the cavity to overmold or encapsulate all the components mounted on the substrate. However, optical components (e.g., light-emitting diodes or "LEDs", photodetectors, etc.)

cannot be overmolded because the molding compound interrupts the transmission and reception of light, thereby diminishing the performance and reliability of such optical components. Similarly, certain micro electro-mechanical system ("MEMS") components can be also susceptible to diminished performance and reliability when overmolded. Therefore, it is most desirable to expose these components (e.g., LED, photodetectors, MEMS components, etc.). However, in one aspect it has been observed that conventional approaches do not provide a way to "expose" all these variable height components simultaneously because typically only the tallest component is exposed.

In accordance with embodiments, an electronic package can include a barrier mounted on a substrate so that when the mold chase is lowered over the substrate, the mold chase contacts the barrier and, in effect, seals off the barrier (and the components located within an interior of the barrier). Further, during the injection phase, the barrier can still allow the components located in an exterior of the barrier to be encapsulated with the molding compound, but at the same time prevent the molding compound from penetrating the barrier and therefore preventing the encapsulation of the components located within the interior of the barrier. In this way, multiple components of variable height can be located within the interior of the barrier and can remain exposed after the encapsulation process. Further, in accordance with embodiments described herein, such a barrier can also be mounted on a top tier of a multi-tiered SiP.

Further, it has been observed that certain temperature sensitive components (e.g., image sensors, lens, etc.) cannot withstand the thermally intensive processes undertaken during encapsulation (e.g., reflow soldering, etc.), causing such temperature sensitive components to become damaged, contaminated or otherwise compromised. In accordance with embodiments, an electronic package can include a barrier mounted on a substrate, where such temperature sensitive components can be located within an interior of the barrier and encapsulated in accordance a low-temperature curing process (e.g., ultraviolet curing), while the components located in an exterior of the barrier can still be encapsulated in accordance with a relatively high-temperature curing process (e.g., thermal curing).

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

FIG. 1A describes an electronic package 100 that includes a barrier for selective molding of variable height components. FIG. 1A includes a first set of components 140 mounted on a bottom side 180 of substrate 181. The first set of components 140 (as well as the second set of components 150) can include any set of components that work together to form a complete system within a single package. For example, the first and second set of components 140, 150 can include various types of digital, analog, or mixed-signal integrated circuit ("IC") components to provide the SiP's core functionality and processing capabilities (e.g., processors, memory chips, sensors, etc.), as well as various types of passive components to provide essential functions such as filtering, energy storage, and impedance matching to ensure proper system operation (e.g., capacitors, resistors, inductors, etc.). In addition, interconnect technologies (e.g., wire bonding, through-silicon via, flip chip, etc.) can facilitate connections between the IC and passive components, which can ultimately be mounted on a common electronic substrate (e.g., printed circuit board, etc.), such as substrate 181.

In the example of FIG. 1A, the first set of components 140 includes IC component 142 and passive component 144, which can be mounted directly to bottom side 180 of substrate 181. It should be noted that IC component 142 and passive component 144 serve only as illustrative components for an exemplary system-in-package, and that other systems can include any number of (or combination of) IC components, passive components or any other component related to the performance and functionality of a particular system. Further, the first set of components 140 on the bottom side 180 of substrate 181 can be encapsulated by a molding compound, such as molding compound 130. Molding compounds (e.g. molding compound 130, molding compound 131, etc.) can include molding compound material such as epoxy molding compound (EMC), which can span across a surface or side of electronic package 100 (e.g. bottom side 180 of substrate 181, top side 182 of substrate 181, etc.) and form an overmolding layer to cover particular components mounted to the various surfaces or sides of substrate 181. Further, molding compounds can include thermally curable molding compounds as well as photochemically curable molding compounds (e.g. UV-curable molding compound, etc.), or molding compounds that are both thermally and photochemically curable (e.g., dual cure). In the example of FIG. 1A, molding compound 130 is a thermally curable molding compound. FIG. 1A also includes a second set of components 150 mounted on top side 182 of substrate 181. Similar to the first set of components 140, the second set of components 150 serves only as illustrative components for an exemplary system-in-package. In the example of FIG. 1A, the second set of components includes IC component 152, passive component 154, optical component 156 (e.g., light-emitting diode, photodetector, etc.) and micro electro-mechanical system ("MEMS") component 158 (e.g., sensors, actuators, switches, etc.).

In further reference to FIG. 1A, electronic package 100 includes barrier 120 mounted on top side 182 of substrate 181. In some embodiments, barrier 120 is composed of metal and can be soldered or otherwise mounted to a surface of substrate 181. In other embodiments, barrier 120 can be composed of dielectric material. As shown in the example of FIG. 1A, an interior set of components (optical component 156 and MEMS component 158) are located within an interior 119 of barrier 120, while an exterior set of components (IC component 152 and passive component 154) are located in an exterior 121 of barrier 120. Further, during the encapsulation process (e.g., transfer molding, compression molding, etc.), a mold chase can contact barrier 120 to effectively "seal off" interior 119 of barrier 120 so that molding compound 131 can flow into a mold cavity created by the mold chase and flow around barrier 120 to encapsulate the components located in exterior 121 of barrier 120 (e.g., IC component 152, passive component 154, etc.), but also prevent molding compound 131 from penetrating barrier 120 and from encapsulating the components within interior 119 of the barrier 120 (e.g., optical component 156, MEMS component 158, etc.). In this way, multiple components that would have been susceptible to degraded performance due to overmolding from molding compound 131 can now be exposed to allow for optimal performance. In addition, since the height H of barrier 120 can be equal to or greater than a height of the tallest component located within interior 119 (e.g., h1 of optical component 156), the mold chase cannot contact (nor potentially damage) the internal set of components located within barrier 120. In this way, barrier 120 serves as a protective barrier that can eliminate the need for additional packaging or encapsulation typically needed to provide such protection. As a result, barrier 120 may act to reduce the profile of an electronic package to achieve better miniaturization. For example, the height of a typical package that includes additional packaging or encapsulation needed to protect the internal set of components may be on the order of 900 microns, whereas a height of a package that incorporates a barrier as described may be on the order of 500 microns.

Figure 1B:
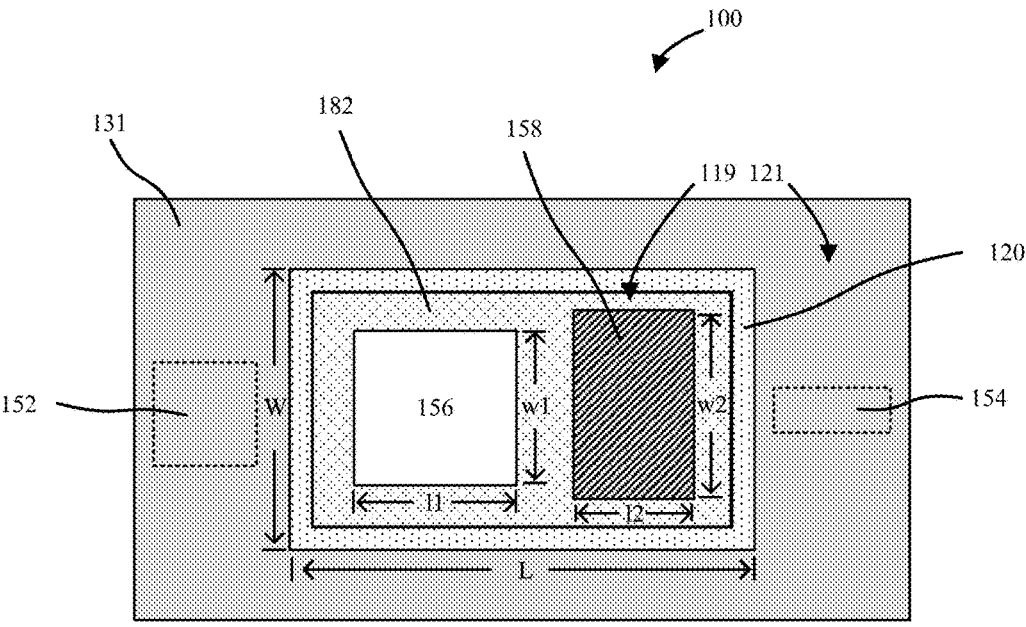
FIG. 1B is a schematic top view illustration of an electronic package including a barrier in accordance with an embodiment.

Referring now to FIG. 1B, a schematic top view illustration of electronic package 100 is shown. Barrier 120 surrounds optical component 156 and MEMS component 158 located within interior 119 of barrier 120, while IC component 152 and passive component 154 (hidden under molding compound 131) are located in exterior 121 of barrier 120. The dimensions of the barrier can be variable based on a desired number of components to be located within the barrier and their respective dimensions. Referring briefly back to the example of FIG. 1A, the height H of barrier 120 is at least as tall as a height of the tallest component to be housed within interior 119 of barrier 120. In the example of FIG. 1A, the height H of barrier 120 is set by the height h1 of optical component 156, which is "taller" than the height h2 of MEMS component 158. Similarly, in FIG. 1B, the length L and width W of barrier 120 can be based on the dimensions of a singular component or the aggregate lengths or widths of multiple components and their arrangement within barrier 120. In the example of FIG. 1B, the length L of barrier 120 is based on the aggregate length of optical component 156 and MEMS component 158 (l1 and l2, respectively, plus any required clearances between the components themselves, and between the components and barrier 120). The width W of barrier 120 is based on the width w2 of MEMS component 158, where the footprint of MEMS component 158 subsumes the footprint of optical component 156. Further, in the embodiment described in FIG. 1B, barrier 120 is rectangular in shape. However, in other embodiments, the barrier can assume a variety of shapes and sizes (e.g., circular, square, etc.) in order to accommodate the dimensions and particular arrangement of components located within interior 119 as well as in exterior 121 of barrier 120.

Figure 3A:
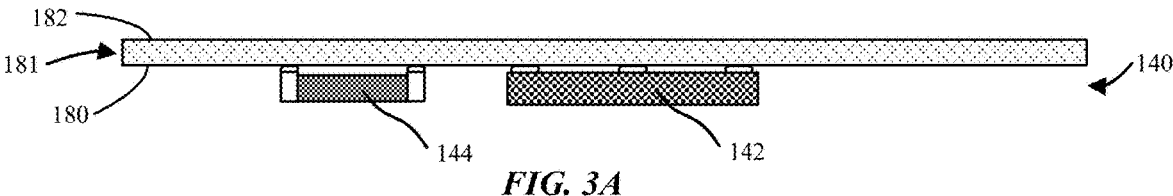
FIG. 3A-3D are schematic cross-sectional side view illustrations of a method of fabricating an electronic package including a barrier in accordance with an embodiment.
Figure 3B:
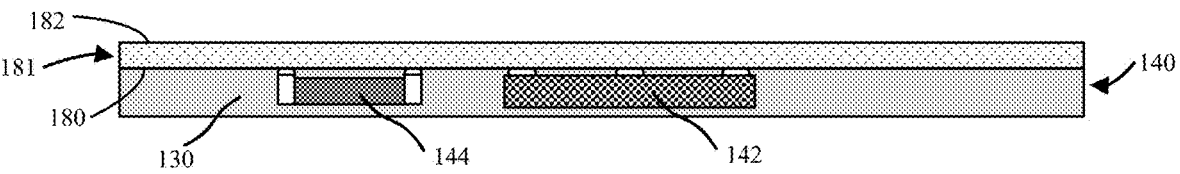
Figure 3C:
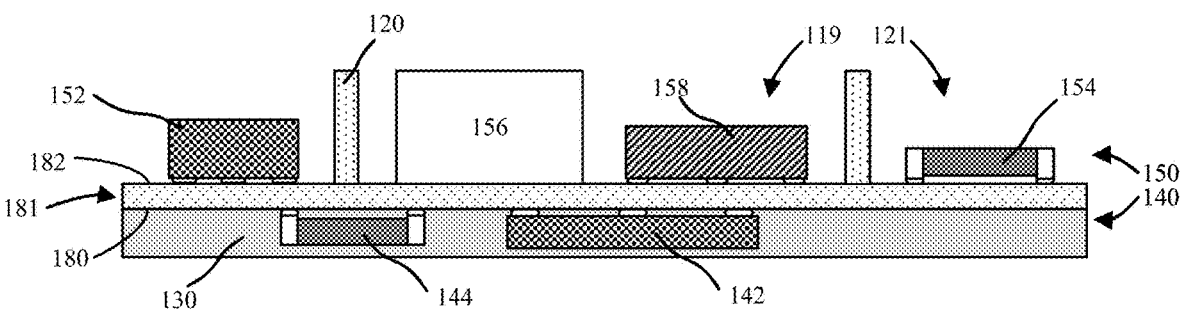

FIG. 2 is a flow chart and FIGS. 3A-3D are schematic cross-sectional side view illustrations of a method for forming electronic package 100 according to the embodiment of FIG. 1A. In the interest of clarity and conciseness, the method of FIG. 2 is described concurrently with the illustrations of FIGS. 3A-3D. As shown in FIG. 3A, the process sequence can begin at operation 2010 with the first set of components 140 (IC component 142 and passive component 144) mounted on the bottom side 180 of substrate 181. As shown in FIG. 3B, in operation 2020 IC component 142 and passive component 144 are encapsulated with molding compound 130 on the bottom side 180 of substrate 181. In operation 2030, FIG. 3C shows the second set of components 150 (IC component 152, passive component 154, optical component 156, MEMS component 158) mounted on the top side 182 of substrate 181. In addition, at operation 2040, FIG. 3C also shows barrier 120 mounted or otherwise formed on the top side 182 of substrate 181. As shown, optical component 156 and MEMS component 158 are located within an interior 119 of barrier 120, while IC component 152 and passive component 154 are located in an exterior 121 of barrier 120.

Figure 3D:
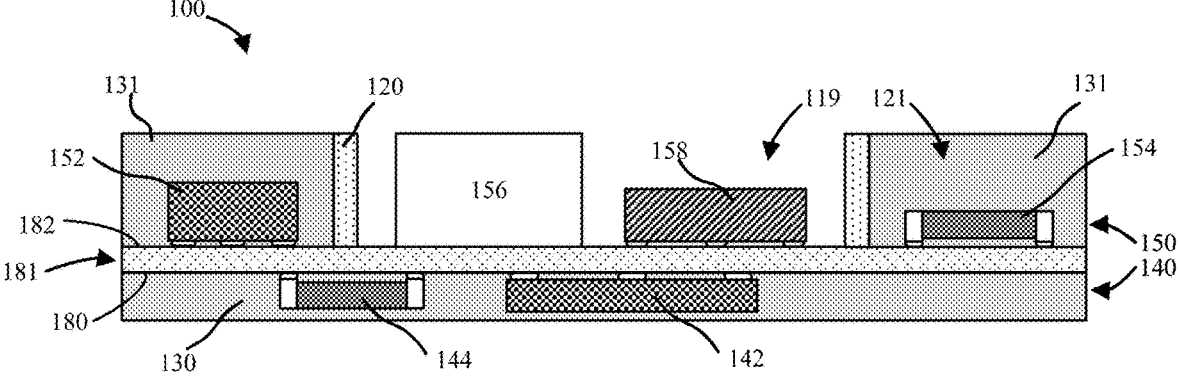

At operation 2050, FIG. 3D shows IC component 152 and passive component 154 located in the exterior 121 of barrier 120 and encapsulated with molding compound 131, while barrier 120 prevents molding compound 131 from penetrating interior 119 and from encapsulating optical component 156 and MEMS component 158 located within interior 119 of the barrier 120. Of note, referring briefly back to FIG. 1A, the height h1 of optical component 156 is different from the height h2 of MEMS component 158. Under conventional methods, only the tallest component (optical component 156, in this case) would be exposed with the remaining components being encapsulated, which can be problematic for some components such as MEMS components since they may be susceptible to strain or diminished performance as a result of overmolding. In the embodiment described, however, both components can be exposed simultaneously due to their location within interior 119 of barrier 120.

Figure 4A:
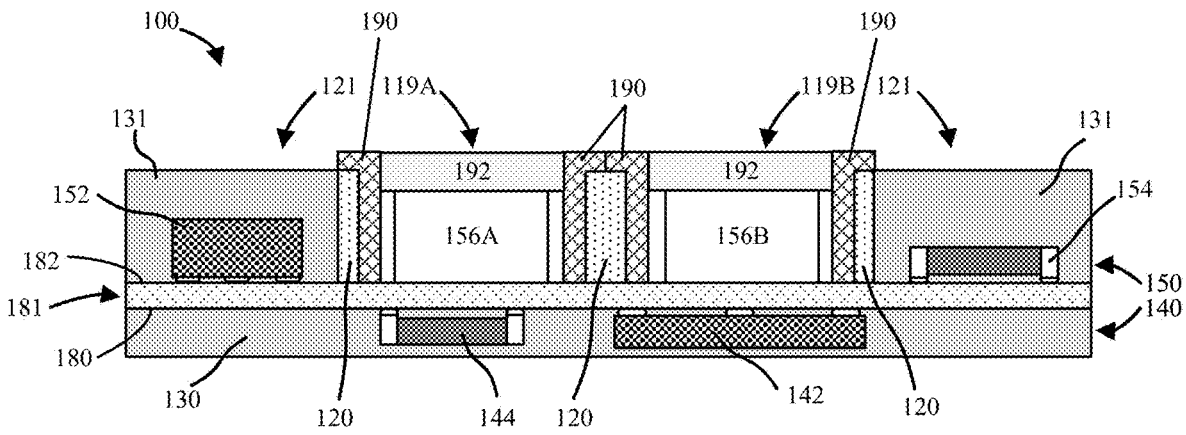
FIG. 4A is a schematic cross-sectional side view illustration of an electronic package including a barrier with a grommet window and lens assembly in accordance with an embodiment.

FIG. 4A is a variation on the embodiment described in FIG. 1A. The example described in FIG. 4A is substantially similar to the example described in FIG. 1A but with the addition of a grommet window and lens assembly. In the example of FIG. 4A, a first set of components 140 includes IC component 142 and passive component 144 encapsulated with molding compound 130 on the bottom side 180 of substrate 181. The second set of components 150 includes IC component 152, passive component 154, and optical components 156A, 156B. Similar to the example of FIG. 1A, IC component 152 and passive component 154 are located in an exterior 121 of barrier 120 and encapsulated with molding compound 131, but barrier 120 prevents the molding compound 131 from penetrating interiors 119A, 119B and encapsulating optical components 156A, 156B. Further, barrier 120 mates to a grommet window 190 so that a lens assembly 192 can be at least partially inset within a profile of the electronic package 100, as opposed to conventional methods, in which grommet windows are typically set on top of the package. In this way, grommet window 190 as described in the example of FIG. 4A can increase the volumetric efficiency of the grommet windows and lens assemblies.

Figure 4B:
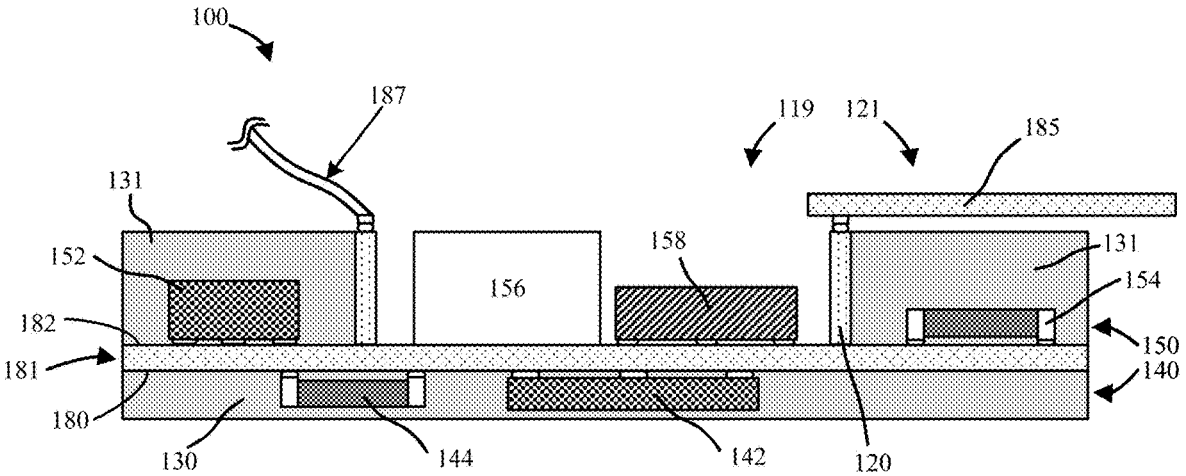
FIG. 4B is a schematic cross-sectional side view illustration of an electronic package including a barrier with an interposer in accordance with an embodiment.

FIG. 4B is a variation to the embodiment described in FIG. 1A. The example described in FIG. 4B is substantially similar to the example described in FIG. 1A but with the addition of an interposer. In the example of FIG. 4B, a first set of components 140 includes IC component 142 and passive component 144 encapsulated in molding compound 130 on the bottom side 180 of substrate 181. The second set of components 150 includes IC component 152, passive component 154, optical component 156, and MEMS component 158. Similar to the example of FIG. 1A, IC component 152 and passive component 154 are located in an exterior 121 of barrier 120 and encapsulated with molding compound 131, but barrier 120 prevents the molding compound 131 from penetrating interior 119 and encapsulating optical component 156 and MEMS component 158. Further, barrier 120 can be an interposer with vertical interconnects to provide a connection between the components mounted on electronic package 100 and other external components, such external substrates (e.g., substrate 185), flexible circuits (e.g., flexible circuit 187), etc.

FIG. 5A describes electronic package 101 that includes a barrier for selective molding to house a camera module and image sensor. The example of FIG. 5A is substantially similar to the example of FIG. 1A, but the example of FIG. 5A includes interior components arranged on top of each other within the barrier (e.g., a camera module stacked on an image sensor), rather than interior components mounted side-by-side (e.g., optical component 156 mounted next to MEMS component 158) as depicted in FIG. 1A. In addition, the components located within an interior of the barrier and the components located in an exterior of the barrier can be encapsulated with different molding compounds.

In reference to FIG. 5A, electronic package 101 includes a first set of components 140 mounted on a bottom side 180 of substrate 181. Similar to the embodiment described in the example of FIG. 1A, the first set of components 140 (as well as second set of components 150) serve only as illustrative components for an exemplary system-in-package. In the example of FIG. 5A, the first set of components 140 includes IC component 142 and passive component 144 mounted directly to the bottom side 180 of substrate 181 and encapsulated with molding compound 130. Further, electronic package 101 includes a second set of components 150. In the example of FIG. 5A, the second set of components 150 includes IC component 152, image sensor 162 (e.g., charge-coupled device, active-pixel sensor, etc.), and camera module 200. Camera module 200 includes an aperture 201, a housing 202 to enclose the optical components of the camera module 200 (e.g., lenses, etc.), a flange 204, and a base 206.

In further reference to FIG. 5A, electronic package 101 includes barrier 220. Barrier 220 described in the example of FIG. 5A is similar to barrier 120 described in FIG. 1A in that both operate to prevent molding compound from penetrating the interior of the barrier. However, barrier 220 depicted in FIG. 5A differs from barrier 120 depicted in FIG. 1A in that barrier 220 includes a seating or step surface to support camera module 200 so as to mitigate stress imposed on image sensor 162, particularly during the molding process. For example, a step surface of barrier 220 can include an upper step wall 222, a step edge 224 and a lower step wall 226, where the step edge 224 supports camera module 200 in order to mitigate any stress imposed on image sensor 162. Also, similar to barrier 120, in some embodiments, barrier 220 is metallic and can be soldered or otherwise mounted onto a surface of substrate 181. In other embodiments, barrier 120 can be composed of dielectric material. Further, an ultraviolet ("UV") reflective coating 250 can be applied to interior 219 of barrier 220 to coat its surfaces (e.g., upper step wall 222, step edge 224, lower step wall 226, etc.). In addition, camera module 200 and image sensor 162 can be encapsulated with molding compound 252. Unlike molding compound 131, which is a thermally cured, molding compound 252 is a photochemically cured. So, during the encapsulation process, image sensor 162 and camera module

200 located within interior 219 of barrier 220 are encapsulated with molding compound 252 utilizing a UV-curing process (e.g., mercury-vapor lamp, etc.), whereas IC component 152 located in an exterior 221 of barrier 220 is encapsulated with molding compound 131 utilizing a thermal curing process.

Referring now to FIGS. 5B and 5C, FIG. 5B is an isometric view of camera module 200 and barrier 220 before mounting; FIG. 5C is an isometric view of camera module 200 and barrier 220 after mounting. In reference to FIG. 5B, UV reflective coating 250 is applied to interior 219 of barrier 220 to coat upper step wall 222, step edge 224 and lower step wall 226. As depicted in FIG. 5C, camera module 200 and image sensor 162 (not illustrated here) are surrounded by molding compound 252, which is UV cured to encapsulate the components within interior 219. Referring briefly back to FIG. 5A, the UV reflective coating 250 can reflect UV light throughout interior 219 of barrier 220 during the UV curing process so that even components located in concealed or "shadowed out" areas, such as base 206 or image sensor 162 located under flange 204, can be encapsulated with molding compound 252 as well.

Figures 7A, 7B, 7C, 7D:
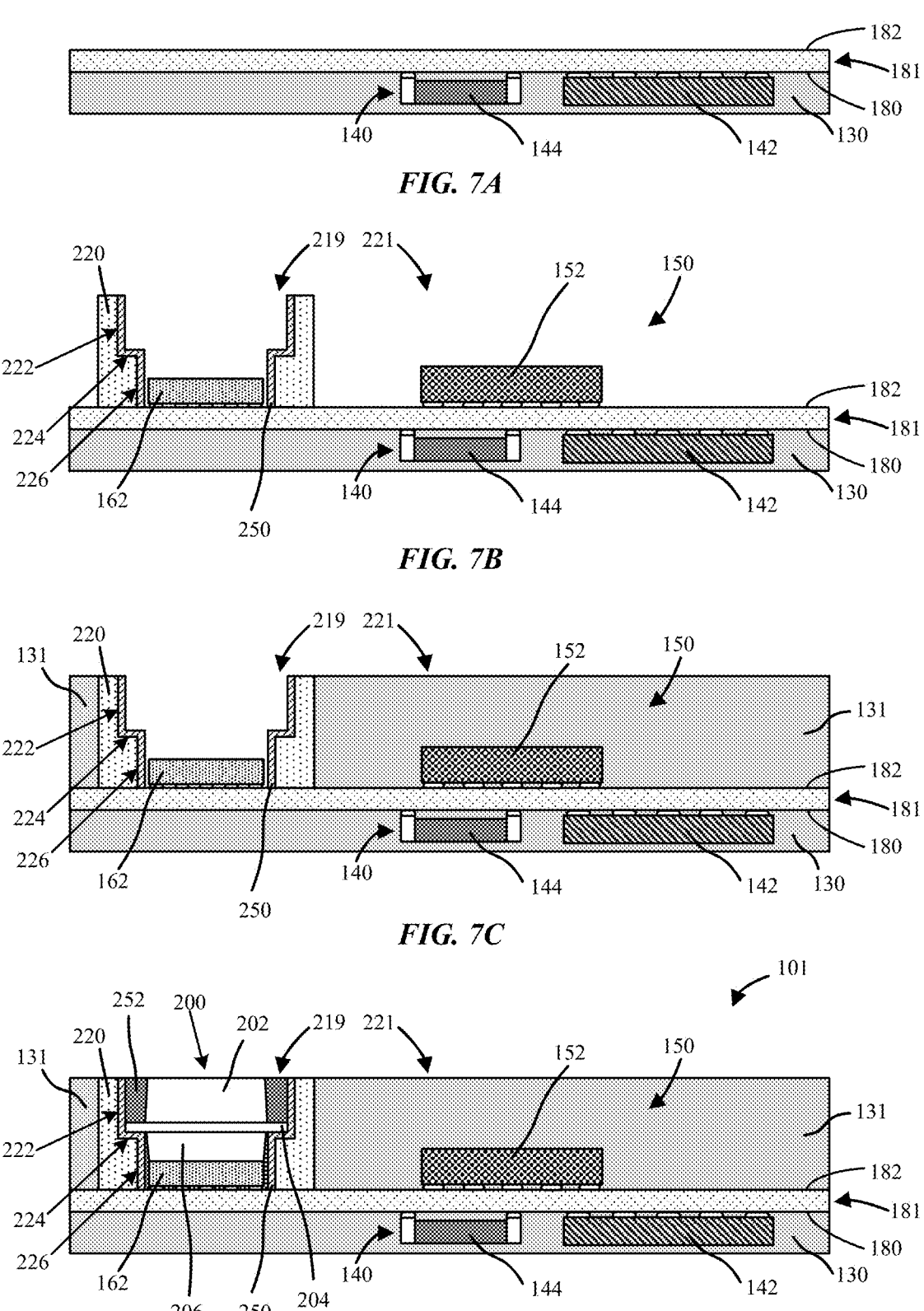
FIG. 7A-7D are schematic cross-sectional side view illustrations of a method of fabricating an electronic package including a barrier with a camera module in accordance with an embodiment.

FIG. 6 is a flow chart and FIGS. 7A-7D are schematic cross-sectional side view illustrations of a method of forming electronic package 101 according to the embodiment of FIG. 5A. In the interest of clarity and conciseness, the method of FIG. 6 is described concurrently with the illustrations of FIGS. 7A-7D. As shown in FIG. 7A, the process sequence can begin at operations 6010 and 6020 with the first set of components 140 (IC component 142 and passive component 144), surface mounted on the bottom side 180 of substrate 181 and encapsulated with molding compound 130. In operation 6030, FIG. 7B shows IC component 152 and image sensor 162 mounted on the top side 182 of substrate 181. In other embodiments, image sensor 162 can be mounted after the encapsulation step at operation 6050. In addition, at operation 6040, FIG. 7B also shows barrier 220 mounted on the top side 182 of substrate 181. Barrier 220 includes a seating or step surface that includes an upper step wall 222, step edge 224 and lower step wall 226. In addition, barrier 220 also includes UV reflective coating 250 applied to interior 219 to coat upper step wall 222, step edge 224 and lower step wall 226. In the embodiment described herein, UV reflective coating 250 is composed of material that can withstand the thermally intensive processes of encapsulation (e.g., reflow soldering, etc.) and can therefore be applied before encapsulation. In other embodiments, UV reflective coating 250 can be composed of material that may not withstand the thermally intensive processes of encapsulation. In such embodiments, UV reflective coating 250 can be applied after the encapsulation step at operation 6050. Further, as illustrated in FIG. 7B, IC component 152 is located in exterior 221 of barrier 220, and image sensor 162 is located in interior 219 of barrier 220.

Referring now to FIG. 7C, operation 6050 shows IC component 152 located in exterior 221 of barrier 220 and encapsulated by molding compound 131, where molding compound 131 does not penetrate the interior 219 of barrier 220. Since molding compound 131 is a thermally cured, the encapsulation of IC component 152 at operation 6050 can include thermally intensive processes (e.g., reflow soldering, etc.), which may damage or contaminate thermally-sensitive optical assemblies. As such, camera module 200 is mounted within barrier 220 after the thermal curing of molding compound 131. As noted above, in some embodiments image sensor 162 (or any other thermally-sensitive component) can also be mounted after the thermal curing of molding compound 131 at operation 6050.

Referring now to FIG. 7D, at operation 6060, camera module 200 is mounted on image sensor 162. In addition, flange 204 of camera module 200 can contact step edge 224 of barrier 220 so that any stress applied to the camera module 200 can be transferred to the barrier 220 rather than image sensor 162. In further reference to FIG. 7D, at operation 6070 camera module 200 and image sensor 162 are encapsulated with molding compound 252, which is a UV-cured. As such, during the encapsulation process at operation 6070, a light source (e.g., mercury-vapor lamp, etc.) can emit light in the UV region of the electromagnetic spectrum into interior 219 of barrier 220, which can then be reflected throughout interior 219 by UV reflective coating 250. As a result, the UV light initiates a photochemical reaction that generates a crosslinked network of polymers in molding compound 252, causing camera module 200 and image sensor 162 to become encapsulated within barrier 220. In this way, temperature-sensitive components, such as camera module 200 and image sensor 162, can be mounted and encapsulated after the mounting and encapsulating of other components in order to avoid exposure to the relatively higher temperatures of other encapsulation processes, which can preserve the integrity and ensure the proper operation of such temperature-sensitive components.

Figures 9A, 9B, 9C, 9D:
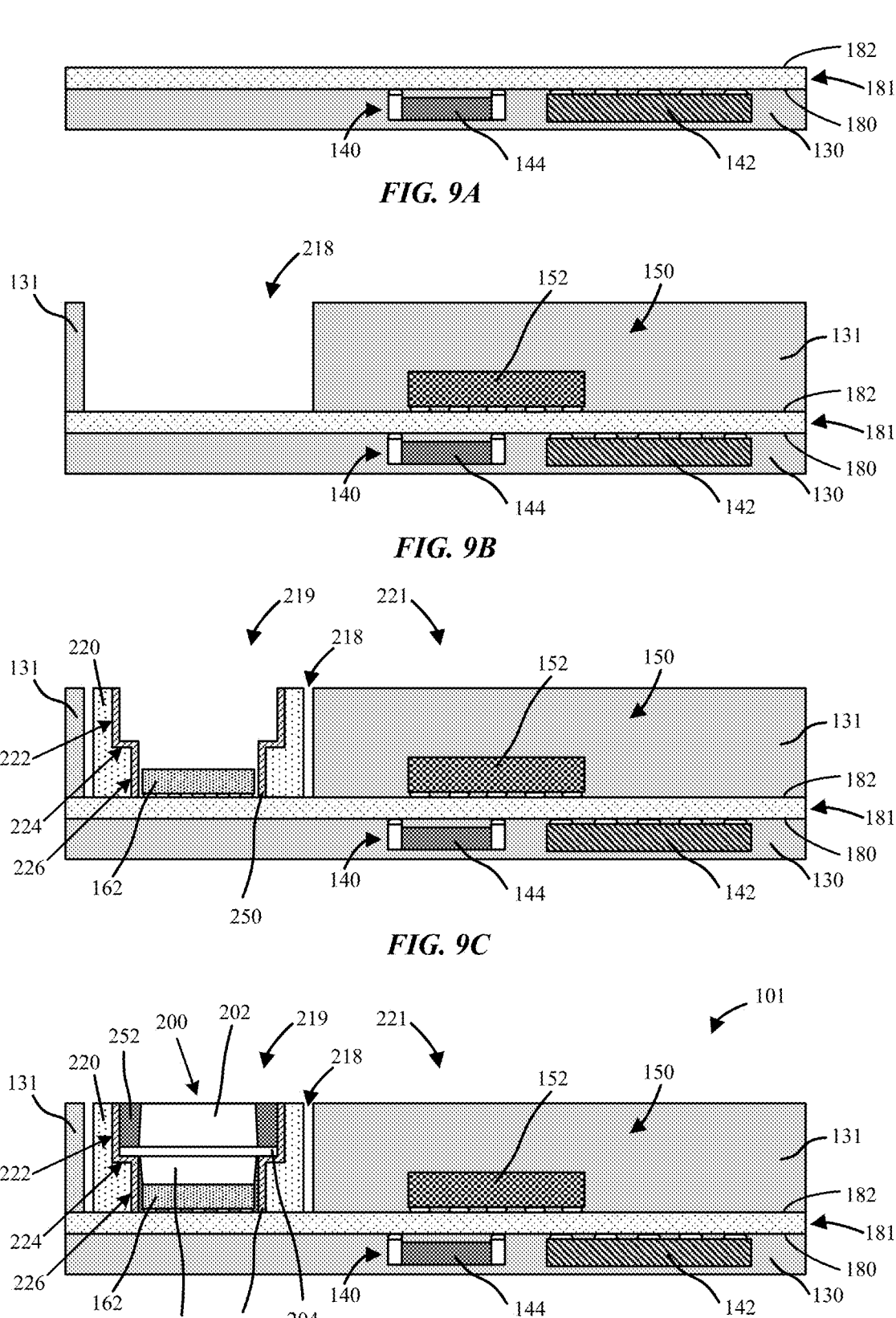
FIG. 9A-9D are schematic cross-sectional side view illustrations of a method of fabricating an electronic package including a barrier with a camera module in accordance with an embodiment.

FIG. 8 is a flow chart and FIGS. 9A-9D are schematic cross-sectional side view illustrations of another method of forming electronic package 101 according to the embodiment of FIG. 5A. The method described here in FIGS. 9A-9D differs from the method described in FIGS. 7A-7D in that the method described here utilizes a selective molding process without the use of a barrier to create the area in which the image sensor and camera module will be located/mounted. In the interest of clarity and conciseness, the method of FIG. 8 is described concurrently with the illustrations of FIGS. 9A-9D. As shown in FIG. 9A, the process sequence can begin at operations 8010 and 8020 with the first set of components 140 (IC component 142 and passive component 144) mounted on the bottom side 180 of substrate 181 and encapsulated with molding compound 130. In operations 8030 and 8040, FIG. 9B shows IC component 152 mounted on the top side 182 of substrate 181 and encapsulated with molding compound 131. For the encapsulation process in FIG. 9B at operation 8040, a mold chase is utilized to selectively mold the top side 182 of substrate 181 to encapsulate IC component 152 and to also create cavity 218.

Referring now to FIG. 9C, operation 8050 shows barrier 220 mounted within cavity 218 on top side 182 of substrate 181, where barrier 220 includes UV reflective coating 250 applied to interior 219 to coat upper step wall 222, step edge 224 and lower step wall 226 of barrier 220. Further, at operation 8060 FIG. 9C shows image sensor 162 mounted within interior 219 of barrier 220. Referring now to FIG. 9D, operation 8070 shows camera module 200 mounted on image sensor 162, where step edge 224 makes contact with flange 204 in order to support camera module 200 and mitigate any stress that may be imposed on image sensor 162. Further at operation 8080, the camera module 200 and image sensor 162 are encapsulated with molding compound 252, which is a UV-curable molding compound. Similar to operation 6070 in FIG. 7D, for the encapsulation process at operation 8080 in FIG. 9D, the UV reflective coating 250 reflects UV light throughout interior 219 to initiate crosslinking and encapsulate camera module 200 and image sensor 162 with molding compound 252.

Figure 11A:
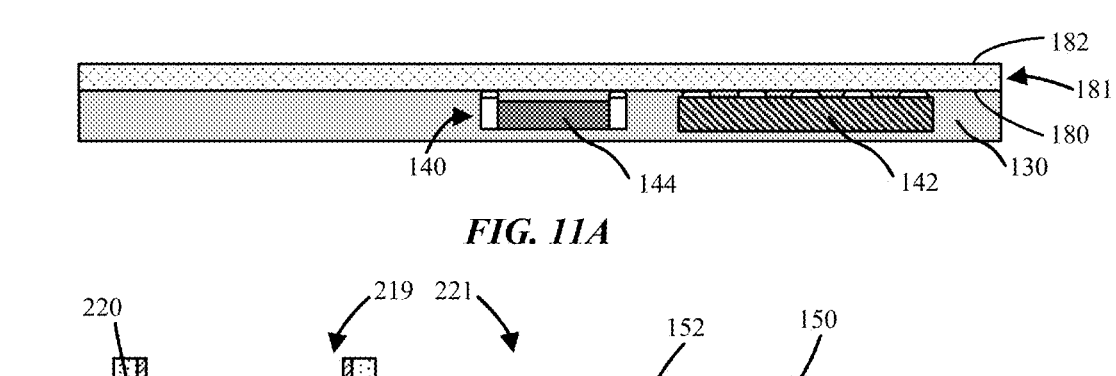
FIG. 11A-11D are schematic cross-sectional side view illustrations of a method of fabricating an electronic package including a barrier with a camera module in accordance with an embodiment.
Figure 11B:
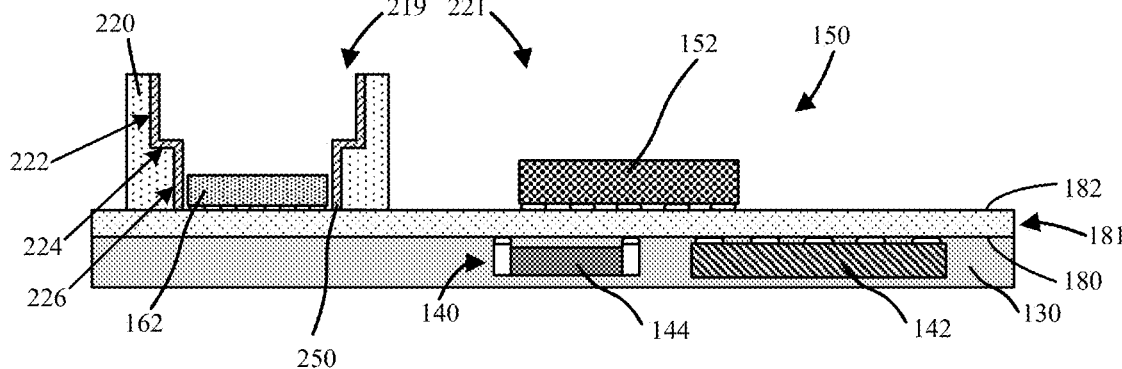

FIG. 10 is a flow chart and FIGS. 11A-11D are schematic cross-sectional side view illustrations of another method of forming electronic package 101 according to the embodiment of FIG. 5A. The method described in FIGS. 11A-11D differs from the method described in FIGS. 7A-7D in that the method here utilizes a low-temperature molding compound. In the interest of clarity and conciseness, the method of FIG. 10 is described concurrently with the illustrations of FIGS. 11A-11D. As shown in FIG. 11A, the process sequence can begin at operations 1010 and 1020 with the first set of components 140 (IC component 142 and passive component 144) mounted on the bottom side 180 of substrate 181 and encapsulated with molding compound 130. In operation 1030, FIG. 11B shows the second set of components 150 (IC component 152, image sensor 162) mounted on the top side 182 of substrate 181. In addition, at operation 1040, FIG. 11B also shows barrier 220 mounted on the top side 182 of substrate 181. Barrier 220 includes a seating or step surface that includes an upper step wall 222, a step edge 224 and a lower step wall 226. Further, barrier 220 also includes UV reflective coating 250 applied to interior 219 to coat upper step wall 222, step edge 224 and lower step wall 226. As shown in FIG. 11B, image sensor 162 is located within interior 219 of barrier 220, while IC component 152 is located in exterior 221 of barrier 220.

Figure 11C:
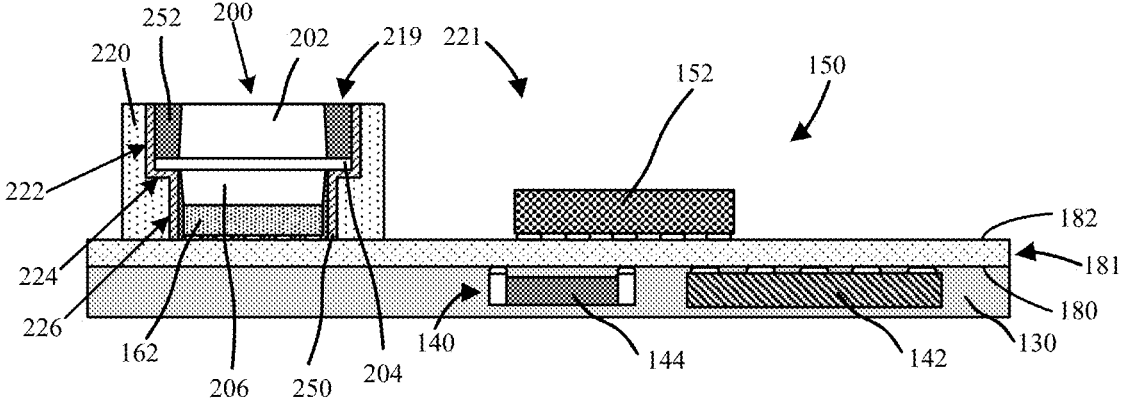
Figure 11D:
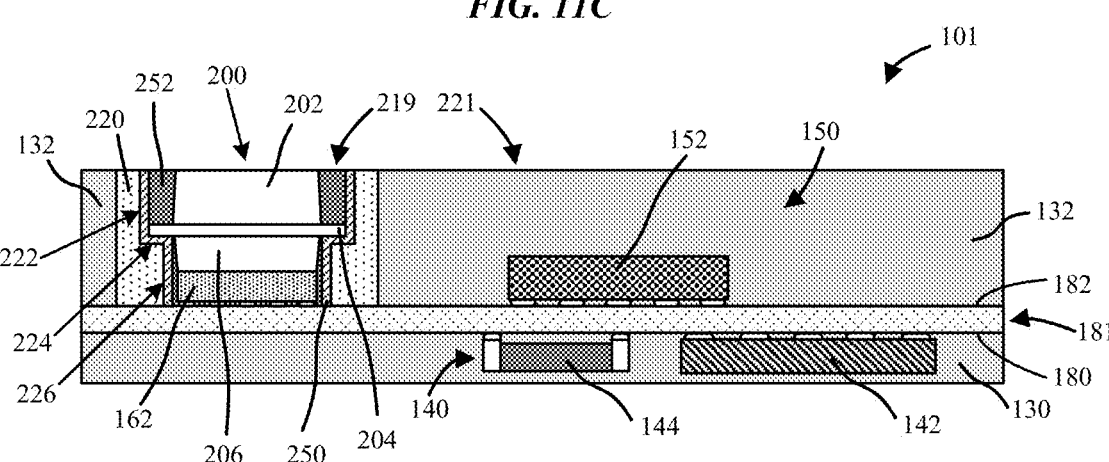

Referring now to FIG. 11C, operation 1050 shows camera module 200 mounted on image sensor 162, where step edge 224 supports camera module 200 at flange 204. Further, at operation 1060 the camera module 200 and image sensor 162 are encapsulated with molding compound 252, which is a UV-curable molding compound that generates a cross-linked network of polymers when exposed to UV light. The UV light is reflected throughout interior 219 of barrier 220 with the aid of UV reflective coating 250 so that all or nearly all areas within interior 219 of barrier 220 (even concealed or shadowed out areas) can be exposed to the UV light and generate crosslinks. At operation 1070, FIG. 11D shows IC component 152 encapsulated with molding compound 132. Like molding compound 130 and molding compound 131, molding compound 132 is thermally cured to encapsulate in order to encapsulate components. However, unlike molding compound 130 and molding compound 131, molding compound 132 is a low-temperature molding compound (e.g., ~70 degrees C.). As such, the embodiment described at operation 1070 in FIG. 11D differs from the embodiments described in FIGS. 7A-7D or FIGS. 9A-9D, in that camera module 200 and image sensor 162 can be encapsulated with molding compound 252 before the encapsulation of the components located in exterior 221 of barrier 220 (e.g., IC component 152) since the thermally intensive processes associated with the relatively high-temperature cure of molding compound 131 in the embodiments described in FIGS. 7A-7D or FIGS. 9A-9D are no longer present due to the utilization of molding compound 132 and its low-temperature cure.

Figure 12A:
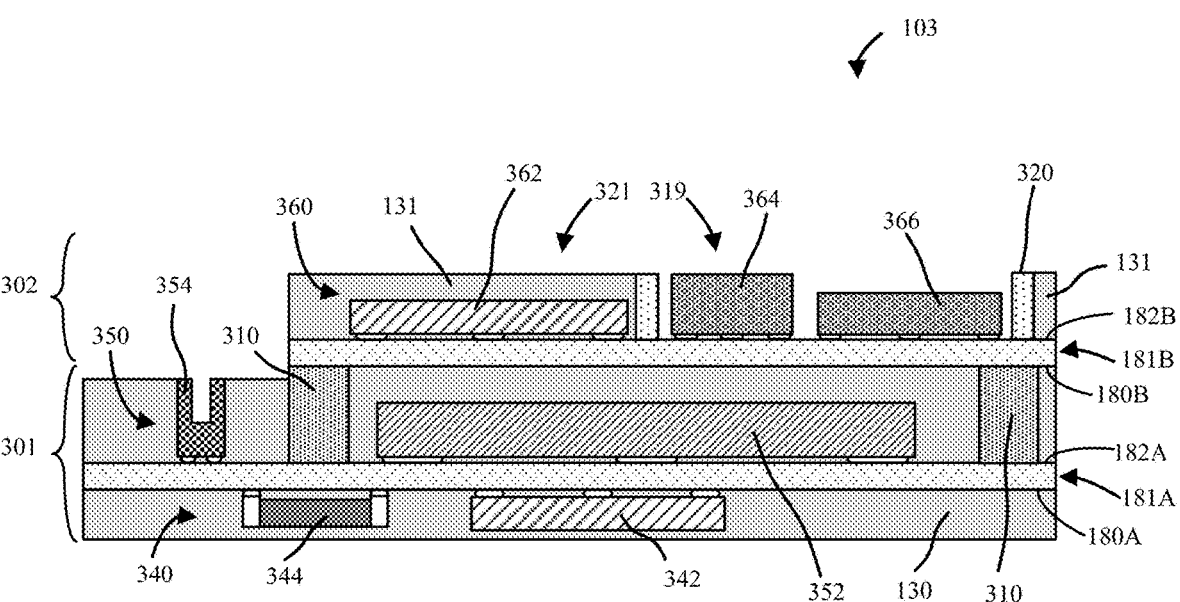
FIG. 12A is a schematic cross-sectional side view illustration of a multi-tiered electronic package including a barrier in accordance with an embodiment.

FIG. 12A describes a multi-tiered package 103 that includes a primary tier 301 and a secondary tier 302. The example of FIG. 12A is substantially similar to the example of FIG. 1A, but the barrier for selective molding of variable height components is located on the secondary (top) tier. For the primary (bottom) tier, a first set of components 340 can be mounted on a bottom side 180A of primary substrate 181A. Similar to the embodiments described in the example of FIG. 1A and FIG. 5A, the first set of components 340 (as well as second set of components 350 and third set of components 360) serve only as illustrative components for an exemplary system-in-package. In the example of FIG.

12A, the first set of components 340 includes IC component 342 and passive component 344, which can be mounted directly to the bottom side 180A of primary substrate 181A. Further, the first set of components 340 (IC component 342 and passive component 344) can be encapsulated with molding compound 130 on the bottom side 180A of primary substrate 181A. In further reference to FIG. 12A, the second set of components 350 includes IC component 352 and connector component 354 mounted on the top side 182A of primary substrate 181A. In addition, multiple support walls 310 can be mounted on the top side 182A of the primary substrate 181A. In some embodiments, the multiple support walls 310 are metallic and can be soldered or otherwise formed on top side 182 of substrate 181. In other embodiments, the multiple support walls 310 can be composed of dielectric material. In other embodiments still, the multiple support walls 310 can be an interposer with vertical interconnects to provide a connection between the various components mounted on the multiple tiers. Further, the multiple support walls are structured to have a height greater than a height of any component in the second set of components 350.

In further reference to FIG. 12A, a third set of components 360 can be mounted on a top side 182B of a secondary substrate 181B. The third set of components 360 includes IC component 362 and connector components 364, 366 of variable height, which can be mounted directly to the top side 182B of secondary substrate 181B. Further, multi-tiered package 103 includes barrier 320 mounted on the top side 182B of secondary substrate 181B. Barrier 320 is substantially similar to barrier 120 depicted in FIG. 1A, except that barrier 320 is located on the secondary tier 302 of the multi-tiered package 103. As shown in the example of FIG. 12A, connector components 364, 366 are located within interior 319 of barrier 320, while IC component 362 is located in exterior 321 of barrier 320. The bottom side 180B of the secondary substrate 181B can be mounted onto the multiple support walls 310 of the primary tier 301. Further, during the encapsulation process, IC component 352 and connector component 354 located on the top side 182A of primary substrate 181A as well as IC component 362 located on the top side 182B of the secondary substrate 181B can be encapsulated with molding compound 131. However, barrier 320 prevents the molding compound from penetrating interior 319 and from encapsulating connector components 364, 366 located within interior 319 of barrier 320. In this way, multiple components of variable heights can be exposed and therefore accessible to connect to other devices.

Figure 12B:
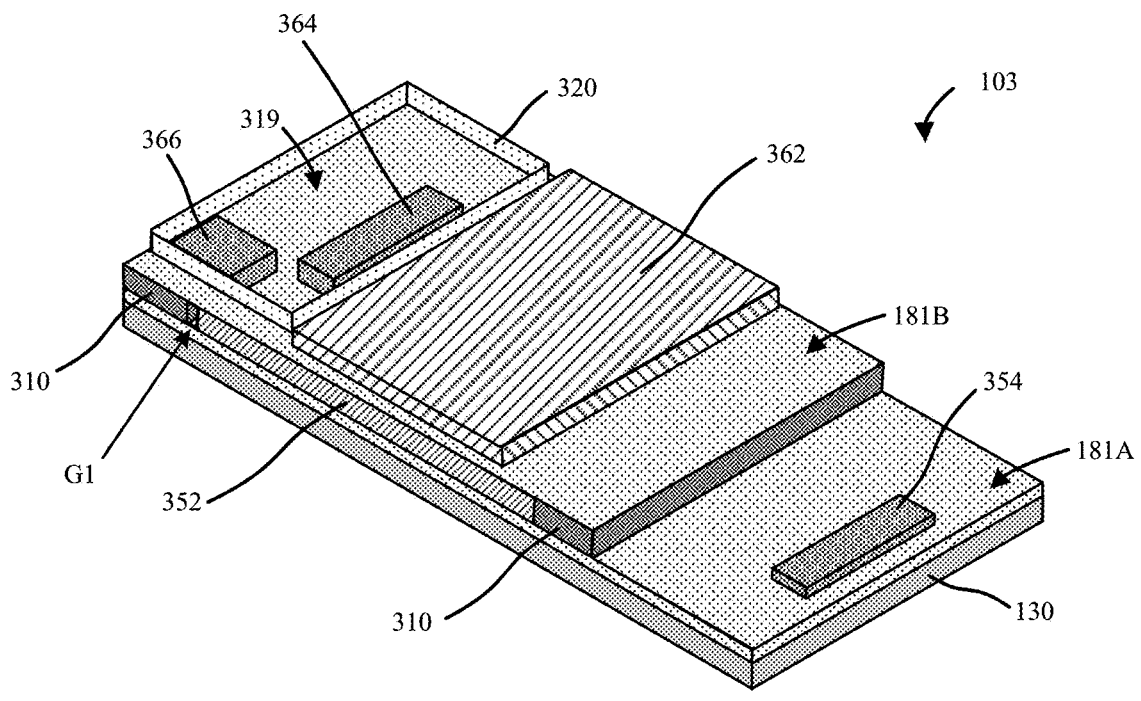
FIG. 12B is an isometric view of a multi-tiered electronic package including a barrier before encapsulation in accordance with an embodiment.
Figure 12C:
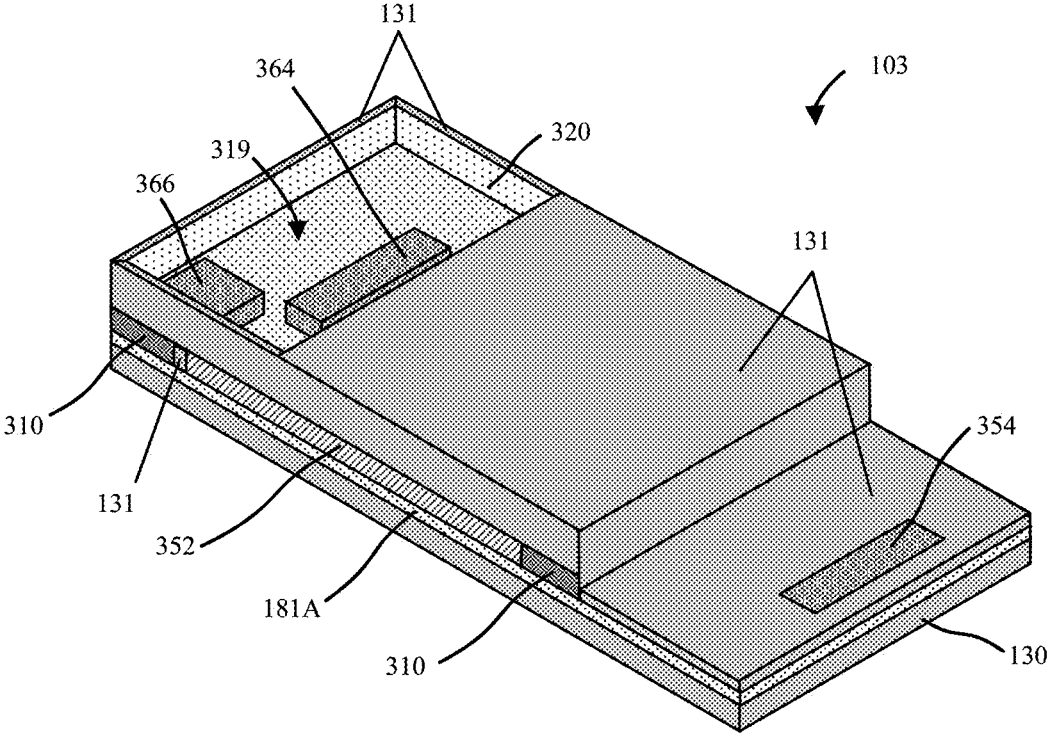
FIG. 12C is an isometric view of a multi-tiered electronic package including a barrier after encapsulation in accordance with an embodiment.

Referring now to FIGS. 12B and 12C, FIG. 12B is an isometric view of multi-tiered package 103 before encapsulation; FIG. 12C is an isometric view of multi-tiered package 103 after encapsulation. FIG. 12B shows various uncovered sections, such as top side 182A of primary substrate 181A, top side 182B of secondary substrate 181B, etc. In addition, referring briefly back to FIG. 12A, gaps exist between the edges of IC component 352 and the edges of the multiple support walls 310, as well as between a top side of IC component 352 and bottom side 180B of secondary substrate 181B. FIG. 12B illustrates such a gap, G1. In further reference to FIG. 12B, during encapsulation, molding compound 131 fills such gaps and also covers the top side 182A of primary substrate 181A and the top side 182B of secondary substrate 181B, as well as the respective components mounted on each substrate. However, barrier 320 prevents the flow of the molding compound 131 from penetrating interior 319 so that the components within interior 319 (connector components 364, 366) remain exposed.

Figure 14A:
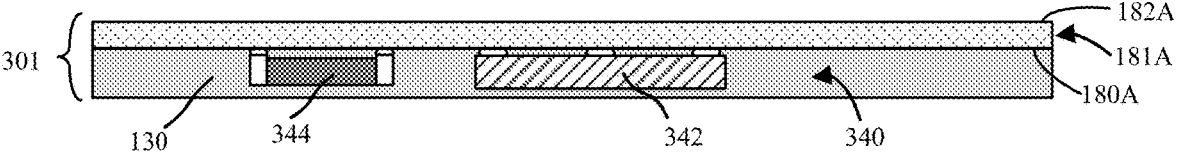
FIG. 14A-14E are schematic cross-sectional side view illustrations of a method of fabricating a multi-tiered electronic package including a barrier in accordance with an embodiment.
Figure 14B:
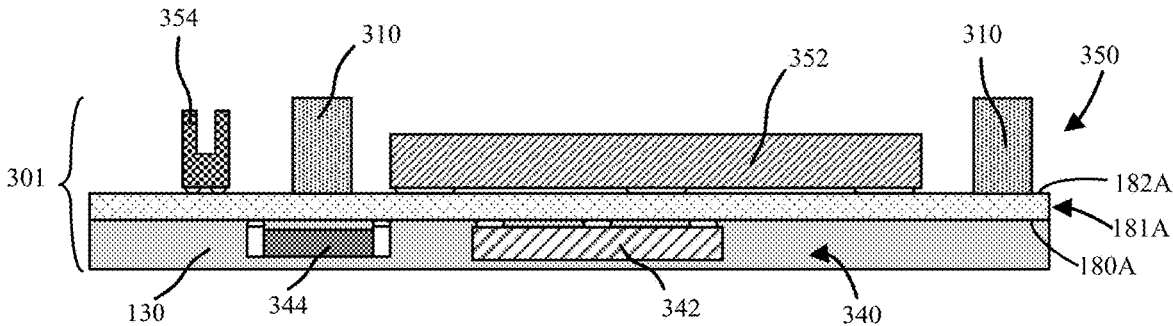
Figure 14C:
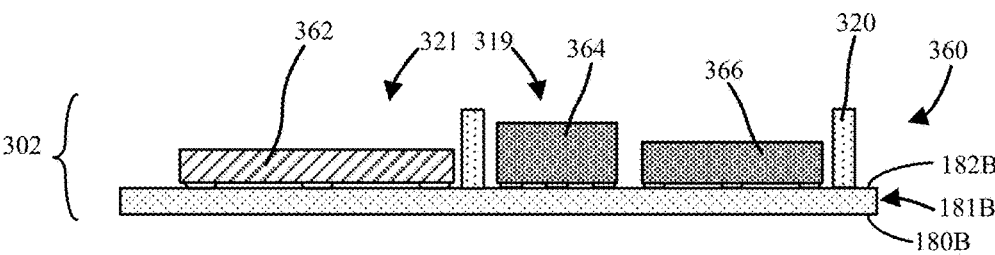
Figure 14D:
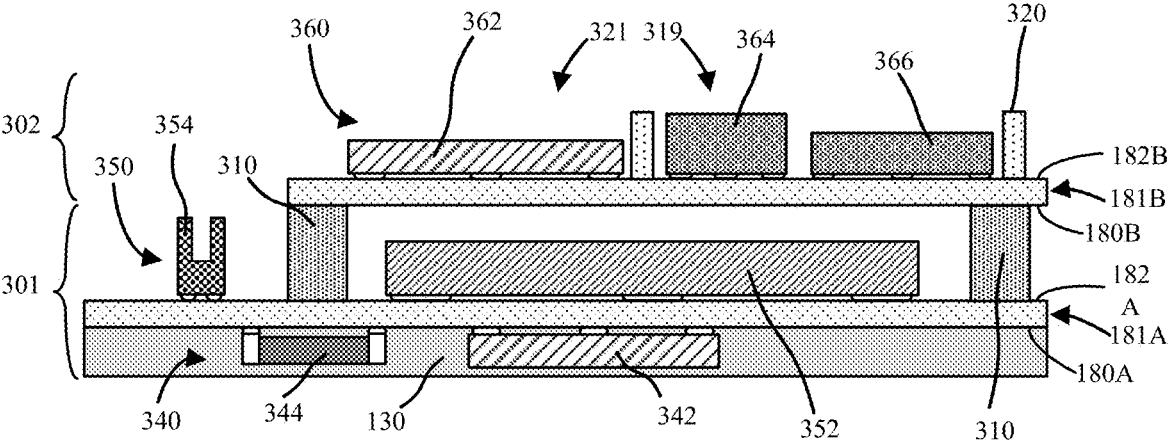
Figure 14E:
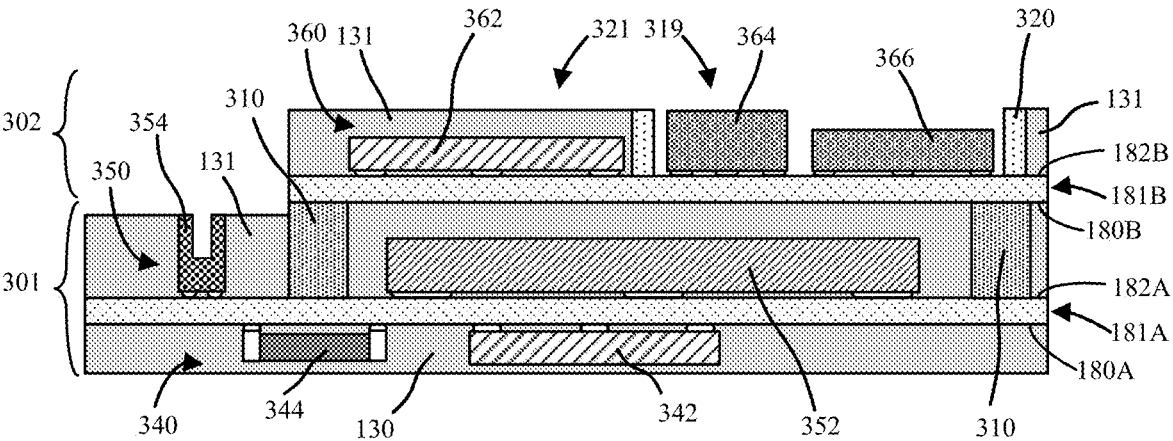

FIG. 13 is a flow chart and FIGS. 14A-14E are schematic cross-sectional side view illustrations of a method for forming multi-tiered package 103 according to the embodiment of FIG. 12A. In the interest of clarity and conciseness, the method of FIG. 13 is described concurrently with the illustrations of FIGS. 14A-14E. As shown in FIG. 14A, the process sequence can begin at operations 1310 and 1320 with the first set of components 340 (IC component 342 and passive component 344) mounted on the bottom side 180A of primary substrate 181A and encapsulated with molding compound 130. In operation 1330, FIG. 14B shows the second set of components 350 (IC component 352, connector component 354) mounted on the top side 182A of primary substrate 181A. In addition, at operation 1340, FIG. 14B also shows multiple support walls 310 mounted or otherwise formed on the top side 182A of primary substrate 181A. At operation 1350, FIG. 14C shows the third set of components 360 (IC component 362, connector component 364, connector component 366) mounted on the top side 182B of secondary substrate 181B. In addition, at operation 1360, FIG. 14C also shows barrier 320 mounted on the top side 182B of secondary substrate 181B. As shown, connector components 364, 366 are located within interior 319 of barrier 320, while IC component 362 is located in exterior 321 of barrier 320. At operation 1370, FIG. 14D shows the secondary tier 302 mounted on top the primary tier 301, where the bottom side 180B of the secondary substrate 181B can be soldered to the multiple support walls 310 of primary tier 301. In operation 1380, FIG. 14E shows IC component 352 and connector component 354 located on the top side 182A of primary substrate 181A as well as IC component 362 located on the top side 182B of the secondary substrate 181B encapsulated with molding compound 131. In addition, barrier 320 prevents the molding compound 131 from penetrating interior 319 and encapsulating connector components 364, 366 located within interior 319 of barrier 320, which remain exposed.

In utilizing the various aspects of the embodiments, it would become apparent to one skilled in the art that combinations or variations of the above embodiments are possible for selective molding of components by using barriers. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. An electronic package comprising:
   a substrate, the substrate including a bottom side and a top side;
   a first set of components mounted on the bottom side of the substrate,
   a barrier mounted on the top side of the substrate, wherein an interior surface of the barrier is coated with an ultraviolet (UV) reflective coating;
   a second set of components mounted on the top side of the substrate, the second set of components including an interior set of components located within an interior of the barrier and an exterior set of components located on an exterior of the barrier;
   a UV-cured molding compound on the top side encapsulating the interior set of components located within the interior of the barrier; and
   a thermally cured molding compound on the top side encapsulating the exterior set of components located on the exterior of the barrier, wherein the thermally cured molding compound does not penetrate the interior of the barrier.

2. The electronic package of claim 1, wherein the interior set of components are mounted side-by-side.

3. The electronic package of claim 2, wherein a height of the barrier is at least as tall as a height of a tallest component of the interior set of components located within the interior of the barrier.

4. The electronic package of claim 1, wherein the interior set of components are arranged on top of each other.

5. The electronic package of claim 4, wherein the interior set of components include an image sensor mounted on the top side of the substrate and a camera module mounted on the image sensor.

6. The electronic package of claim 5, wherein the barrier includes a step surface, the step surface including an upper step wall, a step edge, and a lower step wall.

7. The electronic package of claim 6, wherein the step surface is coated with the ultraviolet (UV) reflective coating.

8. The electronic package of claim 7, wherein a flange of the camera module contacts the step edge of the barrier.

9. The electronic package of claim 1, wherein the thermally cured molding compound is a high-temperature molding compound.

10. The electronic package of claim 1, wherein the thermally cured molding compound is a low-temperature molding compound.

11. The electronic package of claim 1, wherein the first set of components mounted on the bottom side of the substrate are encapsulated with another molding compound.

12. The electronic package of claim 1, wherein the barrier is metallic.

13. The electronic package of claim 1, wherein the barrier is dielectric.

14. The electronic package of claim 1, wherein the barrier mates with a grommet window, the grommet window including a lens assembly.

15. The electronic package of claim 1, wherein the barrier is an interposer.

16. The electronic package of claim 1, wherein the barrier is mounted on a secondary substrate, the secondary substrate being mounted on multiple support walls of a primary substrate.

17. The electronic package of claim 16, wherein the secondary substrate includes a third set of components, the third set of components including connector components.

* * * * *